United States Patent
Bimberg et al.

(10) Patent No.: US 12,095,230 B2
(45) Date of Patent: Sep. 17, 2024

(54) VERTICAL-CAVITY SURFACE-EMITTING LASER

(71) Applicant: Changchun Institute of Optics, Fine Mechanics and Physics, Chinese Academy of Sciences, Jilin (CN)

(72) Inventors: Dieter Bimberg, Berlin (DE); Gunter Larisch, Neuenhagen (DE)

(73) Assignee: Changchun Institute of Optics, Fine Mechanics and Physics, Chinese Academy of Sciences, Jilin (CN)

( * ) Notice: Subject to any disclaimer, the term of this patent is extended or adjusted under 35 U.S.C. 154(b) by 569 days.

(21) Appl. No.: 17/611,548

(22) PCT Filed: May 14, 2020

(86) PCT No.: PCT/EP2020/063500
§ 371 (c)(1),
(2) Date: Nov. 15, 2021

(87) PCT Pub. No.: WO2020/229614
PCT Pub. Date: Nov. 19, 2020

(65) Prior Publication Data
US 2022/0263291 A1 Aug. 18, 2022

(30) Foreign Application Priority Data

May 16, 2019 (EP) .................... 19174870

(51) Int. Cl.
*H01S 5/183* (2006.01)
*H01S 5/20* (2006.01)

(52) U.S. Cl.
CPC .......... *H01S 5/18344* (2013.01); *H01S 5/209* (2013.01)

(58) Field of Classification Search
CPC ............................ H01S 5/18344; H01S 5/209
See application file for complete search history.

(56) References Cited

U.S. PATENT DOCUMENTS

| 5,034,092 A * | 7/1991 | Lebby | ................. H01S 5/18344 257/E21.222 |
| 2004/0258121 A1* | 12/2004 | Lee | ......................... H01S 5/423 372/50.1 |
| 2017/0033535 A1* | 2/2017 | Joseph | ................ H01S 5/18341 |

OTHER PUBLICATIONS

James M. Perkins, et al., "Low Threshold VCSELS Recess-Integrated on Si-CMOS Ics", Massachusetts Institute of Technology; Cambridge, MA; 2007 Conference on Lasers and Electro-Optics, May 5-11, 2007, Baltimore, Maryland; pp. 1-2; XP0313231325, ISBN: 978-1-55752-834-6 (Year: 2007).*

(Continued)

*Primary Examiner* — Tuan N Nguyen
(74) *Attorney, Agent, or Firm* — Gordon Rees Scully & Mansukhani, LLP

(57) ABSTRACT

An exemplary embodiment of the present invention relates to a method of fabricating at least one radiation emitter comprising the steps of depositing an etch stop layer on a top side of a substrate; depositing a layer stack on the etch stop layer, said layer stack comprising a first contact layer, a first reflector, an active region, a second reflector, and a second contact layer; locally removing the layer stack and the etch stop layer, and thereby forming at least one mesa, said at least one mesa comprising an unremoved section of the etch stop layer and a layered pillar which forms a vertical cavity laser structure based on the unremoved layer stack inside the at least one mesa; depositing a protection material on the top side of the substrate and thereby embedding the entire mesa in the protection material wherein the backside of the substrate remains unprotected; removing the substrate by applying at least one etching chemical that is capable of etching the substrate but incapable or less capable of etching the etch stop layer and the protection material; and removing the etch stop layer and thereby exposing the first contact layer of the at least one layered pillar.

16 Claims, 11 Drawing Sheets

(56) References Cited

OTHER PUBLICATIONS

European Search Report dated Nov. 4, 2019 issued by the European Patent Office in related European Patent Application No. 19174870.6; filed May 16, 2019.
James M. Perkins, et al., "Low Threshold VCSELS Recess-Integrated on Si-CMOS Ics", Massachusetts Institute of Technology; Cambridge, MA; 2007 Conference on Lasers and Electro-Optics, May 5-11, 2007, Baltimore, Maryland; pp. 1-2; XP0313231325, Isbn: 978-1-55752-834-6.
Rui Pu, et al.; "Hybrid Integration of VCSEL's to CMOS Integrated Circuits", IEEE Journal of Selected Topics in Quantum Electronics, Apr. 30, 1999; vol. 5; No. 2; pp. 201-208, XP055419847.
Jean-Francois Seurin et al.; "Progress in High-Power High-Efficiency VCSEL Arrays", SPIE, vol. 7229 722903-2; Jan. 1, 2009, XP040493522.
International Search Report dated Sep. 7, 2020 issued by the International Searching Authority in the related International Application No. PCT/EP2020/063500; filed May 14, 2020.

\* cited by examiner

VERTICAL-CAVITY SURFACE-EMITTING LASER

The present application claims the benefit of and priority to European Patent Application EP19174870.6 filed on May 16, 2019. The foregoing application is incorporated by reference herein in its entirety.

BACKGROUND OF THE INVENTION

Vertical cavity surface emitting lasers VCSELs are key enabling devices as light sources in transmitters, meeting all requirements for optical interconnects, presently in the 1-1000 m range. Large data rates, low power consumption and cost present some of the advantages of VCSELs. Most of these advantages are not fully exploited or get lost in modules, since the necessary integration with drivers, let them be Si- or GaAs-based, presently is inadequate. In addition the distances being bridged by such interconnects are as well increasing to distances beyond 1 km as decreasing to below 1 m. In both cases today wavelength multiplexing and densely packed laser arrays, e.g. in connection with multi core fibers, are considered as the most important approach, increasing the capacity of interconnects by a factor of 10, or more in the future.

A VCSEL wafer may consist of a stack of more than 100 different epitaxial layers. Typically, 50 processing steps are needed to produce high-performance VCSELs. Since many thousand up to several ten thousand of devices are on one, e.g. 6" wafer, the cost of a single device is despite the design complexities low. All known standard processes are based on processing of one side of the wafer such that n- and p-contacts are on the same side, leading to large device footprints. The only tested exception is a backside contact on the substrate, which however leads to very large parasitics and excludes high frequency applications.

FIG. 14 illustrates an embodiment of a fully processed, non-planarized and substrate-bonded VCSEL 100 according to prior art. The VCSEL 100 comprises a layer stack LS having a first contact layer 7, a first reflector 2, an active region AR, intermediate layers, an oxide-aperture OA, a second reflector 1 and a second contact layer 4. The layer stack LS is deposited on a substrate 3 that is planarized with BCB 12. Contact pads 13 are connected to the first contact layer 7 and the second contact layer 4. The second contact layer 4 is ring-shaped in order to allow radiation P to leave the VCSEL 100. The substrate 3 is typically connected to a carrier (not shown in FIG. 14) that has a large thermal conductivity and serves for heat removal. An electrical contact to the driver electronics is typically achieved by using bonding wires (not shown in FIG. 14). The inductivity of these wires contributes to large electrical parasitics.

Methods of fabricating radiation emitters are described in "Low Threshold VCSELs Recess-Integrated on SiCMOS ICs" (Perkips J. M. et al, Cleo '07.2007 Conference on lasers and electro-optics 5-11 May 2007 Baltimore, Md., USA, OSA, Piscataway, N.J., USA, 6 May 2007 (2007 May 6), pages 1-2, XP031231325, ISBN: 978-1-55752-834-6) and "Hybrid integration of VCSELs to CMOS integrated circuits", (R. Pu et al., IEEE Journal of Selected Topics in Quantum Electronics, 30 Apr. 1999 (1999 Apr. 30), pages 201-208, XP055419847, DOI: 10.1109/2944.778285; Retrieved from the Internet: URL:https://www.engr.colostate.edu/ece/faculty/wilmsen/pdf/journals/124.pdf [retrieved on 2017 Oct. 27]).

Another method of fabricating radiation emitters is disclosed in "Progress in high-power high-efficiency VCSEL arrays", Seurin, Spie, PO Box 10 Bellingham Wash. 98227-0010 USA, 1 Jan. 2009 (2009 Jan. 1), XP040493522).

For future highly integrated Si-photonic transmitters more efficient transfer and integration processes are needed. One challenge to keep the cost at acceptable levels presents the development of processes for a parallel transfer of thousands of devices in one process step instead of single device pick and place.

OBJECTIVE OF THE PRESENT INVENTION

In view of the above, an objective of the present invention is to provide improved radiation emitters and improved methods of fabricating radiation emitters.

BRIEF SUMMARY OF THE INVENTION

An exemplary embodiment of the present invention relates to a method of fabricating at least one radiation emitter comprising the steps of depositing an etch stop layer on a top side of a substrate;
  depositing a layer stack on the etch stop layer, said layer stack comprising a first contact layer, a first reflector, an active region, a second reflector, and a second contact layer;
  locally removing the layer stack and the etch stop layer, and thereby forming at least one mesa, said at least one mesa comprising an unremoved section of the etch stop layer and a layered pillar which forms a vertical cavity laser structure based on the unremoved layer stack inside the at least one mesa;
  depositing a protection material on the top side of the substrate and thereby embedding the entire mesa in the protection material wherein the backside of the substrate remains unprotected;
  removing the substrate by applying at least one etching chemical that is capable of etching the substrate but incapable or less capable of etching the etch stop layer and the protection material; and
  removing the etch stop layer and thereby exposing the first contact layer of the at least one layered pillar.

The embodiment as described above may have, but does not need to have, one or more of the following features, which are considered to provide further advantages, but are not mandatory:

Said step of locally removing the layer stack and the etch stop layer may further include locally removing substrate material from the top side of the substrate such that the at least one mesa also comprises an unremoved surface section of the substrate.

Said step of depositing the protection material on the top side of the substrate may also include embedding the unremoved surface section of the substrate in the protection material.

The first contact layer of the layered pillar is preferably exposed by said step of removing the etch stop layer.

A metal layer may be deposited on the exposed first contact layer. The metal layer then covers the first contact layer and forms the base of the layered pillar.

The method may further include providing a second substrate. The base of the at least one layered pillar may be placed (e.g. glued or soldered) directly on the second substrate, on at least one electrical contact pad that is already located on the second substrate, or on another device (e.g. a driver) that is already located on the second substrate.

Preferably, at least one electrical driver is arranged on the second substrate before or after mounting the at least one layered pillar.

The at least one electrical driver may be configured to electrically drive the vertical cavity laser structure of the at least one layered pillar. The electrical driver may be connected to or alternatively carry the at least one electrical contact pad.

The step of mounting the at least one layered pillar (e.g. the step of placing the pillar directly on the second substrate, on at least one electrical contact pad that is already located on the second substrate, or on another device that is already located on the second substrate) is preferably carried out before removing the protection material.

The base of the at least one layered pillar is preferably mounted on an electrical contact pad after aligning the base relative to the electrical contact pad by mechanically adjusting the positions of the protection material and the second substrate relative to each other.

Further, a carrier may be mounted on top of the protection material. Then, the step of aligning the base relative to the electrical contact pad may be carried out by mechanically adjusting the positions of the carrier and the second substrate relative to each other.

The carrier and/or the protection material are preferably transparent for visible light. For instance, the carrier may consist of or comprise sapphire.

The at least one layered pillar may itself form the radiation emitter. Alternatively, the radiation emitter may comprise further components such as for instance drivers and/or more than one layered pillar as described above.

For instance, said step of locally removing the layer stack may include forming a plurality of mesas. Each of the mesas preferably comprises an unremoved section of the etch stop layer and a layered pillar which forms a vertical cavity laser structure based on the unremoved layer stack inside the respective mesa.

Said step of depositing a protection material on the top side of the substrate may include embedding said plurality of mesas in the protection material.

Said step of removing the substrate by applying said at least one etching chemical preferably includes detaching the layered pillars from one another in order to provide a plurality of separate self-contained vertical cavity laser structures.

Said step of locally removing the layer stack and the etch stop layer may further include locally removing substrate material from the top side of the substrate such that each mesa also comprises an unremoved surface section of the substrate.

Said step of depositing the protection material preferably also includes embedding the unremoved surface sections of the substrate.

Said step of removing the etch stop layer preferably includes exposing the bases of the layered pillars.

At least one driver is preferably fabricated for each of the layered pillars on the second substrate.

Each of the drivers preferably provides an electrical contact pad. The position of each contact pad on the second substrate preferably corresponds to the position of an individually assigned layered pillar inside the protection material.

The bases of the layered pillars are preferably aligned relative to the electrical contact pads by mechanically adjusting the positions of the protection material and the second substrate relative to each other.

Furthermore, the method may comprise mounting a carrier on top of the protection material and aligning the bases of layered pillars relative to the electrical contact pads by mechanically adjusting the positions of the carrier and the second substrate relative to each other.

The etch stop layer preferably consists of or comprises AlAs-material and/or AlGaP.

The layer stack preferably consists of or comprises layers of $Ga_xAl_{1-x}As$-material, $Ga_xIn_{1-x}As_yP_{1-y}$-material, or similar ternary, quaternary or quinternary III-V-materials.

The protection material is preferably a resin.

The carrier preferably consists of or comprises sapphire and/or silicon carbide.

Said at least one etching chemical that is used to remove the substrate preferably consists of or comprises a mixture of $H_2O_2$ and $NH_4OH$, and/or a mixture of $H_2O_2$ and $H_2SO_4$, and/or a mixture of $H_2O_2$ and $C_6H_8O_7$, and/or a mixture of $H_2SO_4$ and $KBrO_3$, and/or a mixture of $H_2O_2$ and $HCl$.

Said step of locally removing the layer stack and the etch stop layer preferably includes dry etching, preferably based on chlorine and/or bromine gas.

Said step of locally removing the layer stack and the etch stop layer may include forming a stepped mesa comprising at least an upper mesa section and a lower mesa section of different cross-sections.

The vertical cavity laser structure of the at least one radiation emitter is preferably fabricated to emit radiation through the first reflector and/or the second reflector.

The protection material is preferably transparent for visible light.

The carrier is preferably transparent for visible light.

A further embodiment of the present invention relates to a radiation emitter comprising at least two separate substrate-less layered pillars. The substrate-less layered pillars each form a self-contained vertical cavity laser structure. The substrate-less layered pillars are pieces of the very same dismembered layer stack.

The radiation emitter is preferably fabricated as described above.

The radiation emitter may comprise a substrate on which a plurality of layered pillars is mounted. Above the layered pillars, a multi-core fiber may be arranged. Each core of the multi-core fiber may be individually assigned to a layered pillar. During operation the layered pillars may generate radiation which is coupled into the individually assigned cores of the multi-core fiber.

BRIEF DESCRIPTION OF THE DRAWINGS

In order that the manner, in which the above-recited and other advantages of the invention are obtained, will be readily understood, a more particular description of the invention briefly described above will be rendered by reference to specific embodiments thereof, which are illustrated in the appended figures. Understanding that these figures depict only typical embodiments of the invention and are therefore not to be considered limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout.

It will be readily understood that the parameters of the embodiments of the present invention, as generally described herein, could vary in a wide range. Thus, the following more detailed description of exemplary embodiments of the present invention, is not intended to limit the scope of the invention but is merely representative of presently preferred embodiments of the invention.

FIGS. 1 to 6 illustrate an exemplary embodiment of a method of fabricating a radiation emitter in form of a VCSEL according to the present invention.

Figure 1:
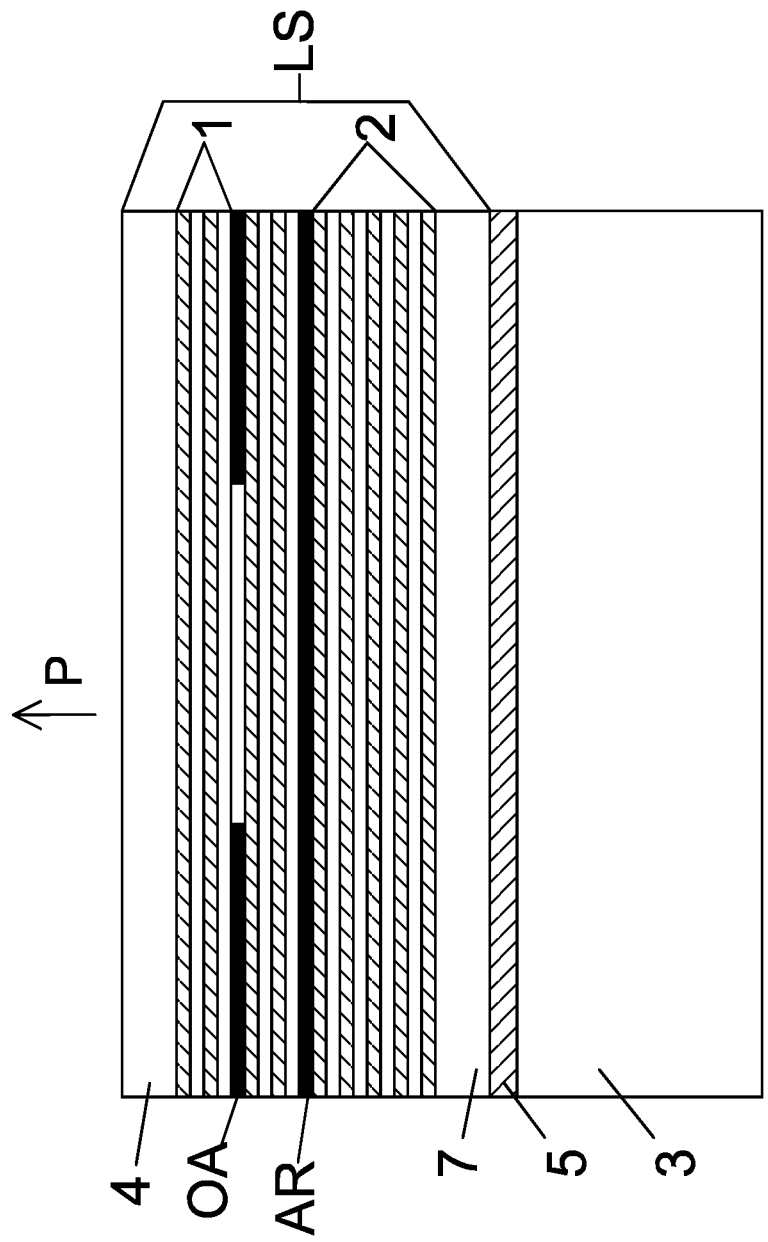
FIG. 1-6 illustrate a first exemplary embodiment of a method of fabricating a substrate-less radiation emitter according to the present invention.

FIG. 1 shows an etch stop layer 5 and a layer stack LS which are deposited on a top side of a substrate 3. The layer stack LS comprises a first contact layer 7 (preferably a highly n-doped layer), a first reflector 2, an active region AR, intermediate layers, an oxide-aperture OA, a second reflector 1, and a second contact layer (preferably a highly p-doped layer) 4. The first and second reflectors 2, 1 are preferably DBR reflectors. The first and second reflectors 2, 1 as well as the active region AR preferably each comprise a plurality of layers as known in the art. The first and second contact layer 7, 4 may consist of a single layer and/or a stack of sublayers. An oxide aperture inside the active region AR may guide the current and light during operation of the laser structure once it is completed.

Figure 2:
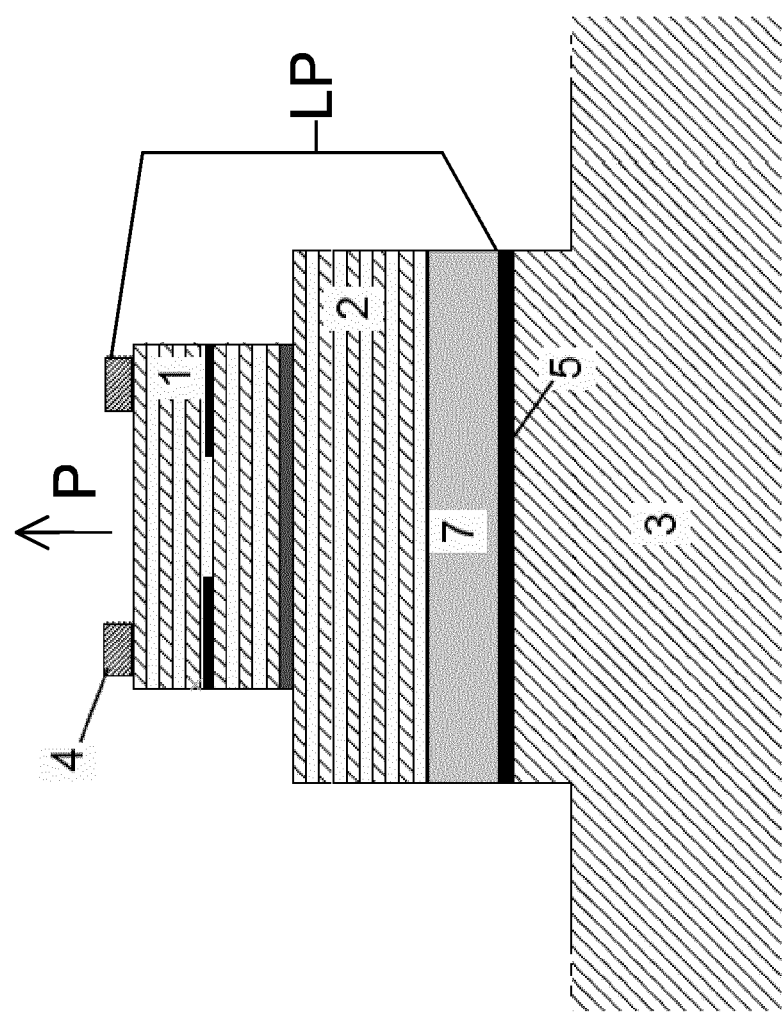

FIG. 2 shows a mesa that is formed by locally removing the layer stack LS (see FIG. 1) and the etch stop layer 5. The mesa comprises an upper mesa section and a lower mesa section of different cross-sections.

The mesa consists of an unremoved section of the etch stop layer 5 and a layered pillar LP which forms a vertical cavity laser structure based on the unremoved layer stack LS (see FIG. 1) inside the mesa. The mesa is preferably dry etched, for instance based on reactive ion etching (RIE). Etching is preferably stopped inside the substrate 3 below the sacrificial etch stop layer 5.

Figure 3:
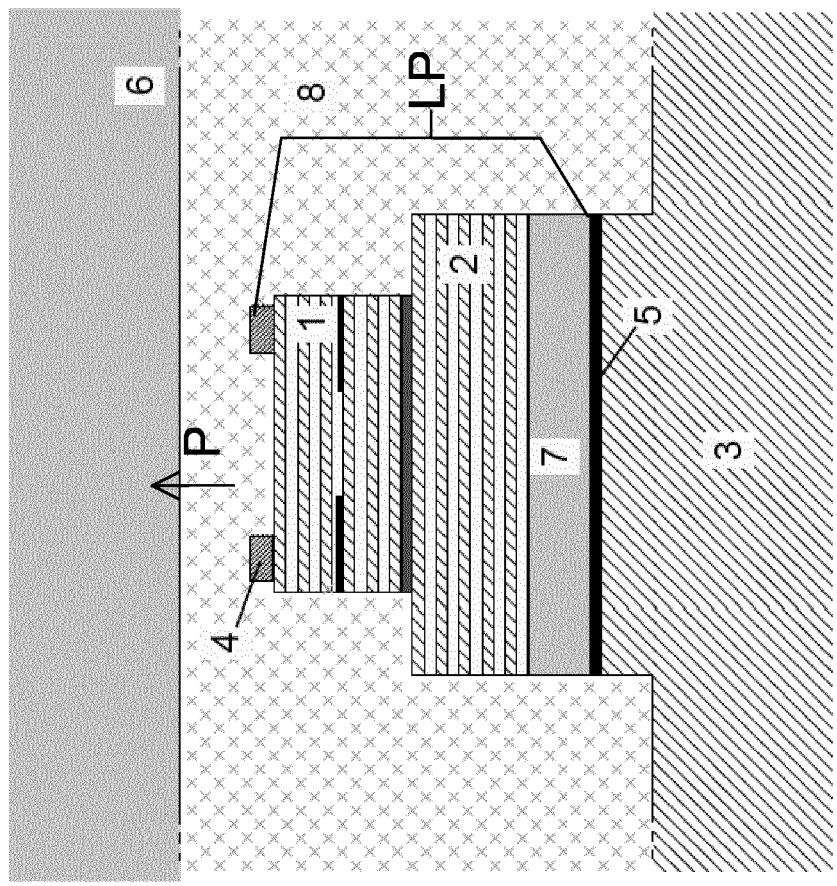

FIG. 3 illustrates the structure of FIG. 2 after depositing a protection material 8 on the top side of the substrate 3 and thereby embedding the entire mesa in the protection material 8. The backside of the substrate 3 remains unprotected.

The protection material 8 may be a resin that resists a subsequent wet etch. A resin provides the advantage that it can be completely removed by heating it up in a solvent after finishing the fabrication process. To achieve reliable coverage of the mesa side walls the viscosity of protection material 8 is preferably very low. After curing, the protection material 8 should be solid enough to hold and carry the layered pillar LP reliably. A suitable resin is e.g. ???.

In the exemplary embodiment of FIG. 3, a carrier 6 is mounted on top of the cured protection material 8. The carrier 6 preferably consists of transparent material, e.g. sapphire. The carrier 6 resists the etchant that is applied thereafter, and avoids stretching, bending, and breaking of the protection material 8.

Figure 4:
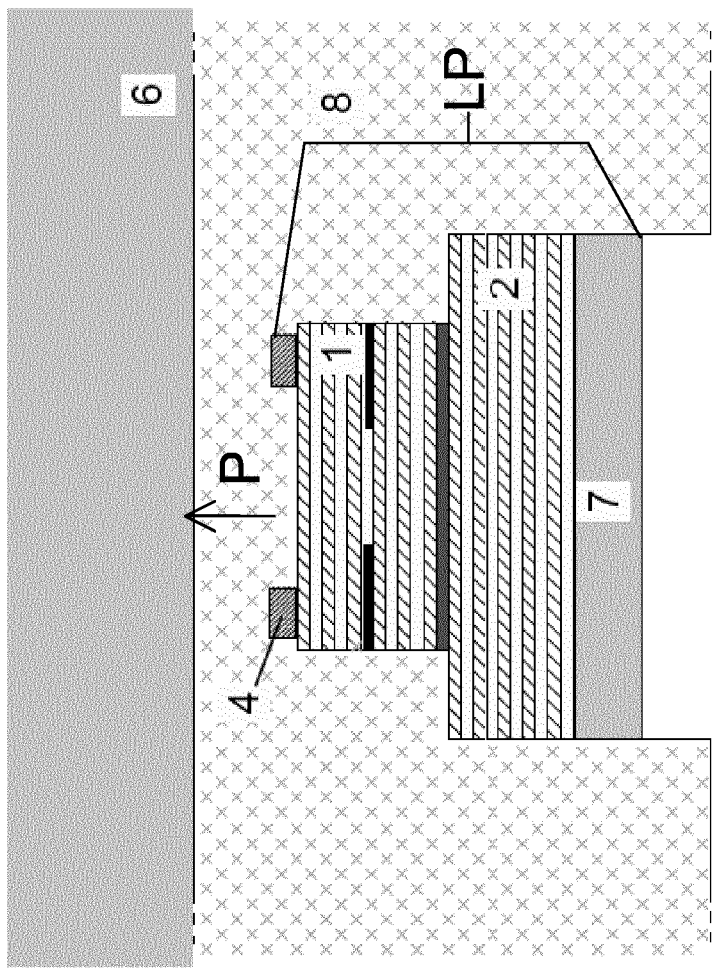

FIG. 4 shows the structure of FIG. 3 after completely removing the substrate 3 by a wet etching process or a combination of thinning followed by wet etching until the etch stop layer 5 is exposed. Then, the etch stop layer 5 is removed (e.g. etched) and the first contact layer 7 of the layered pillar LP is exposed.

Figure 5:
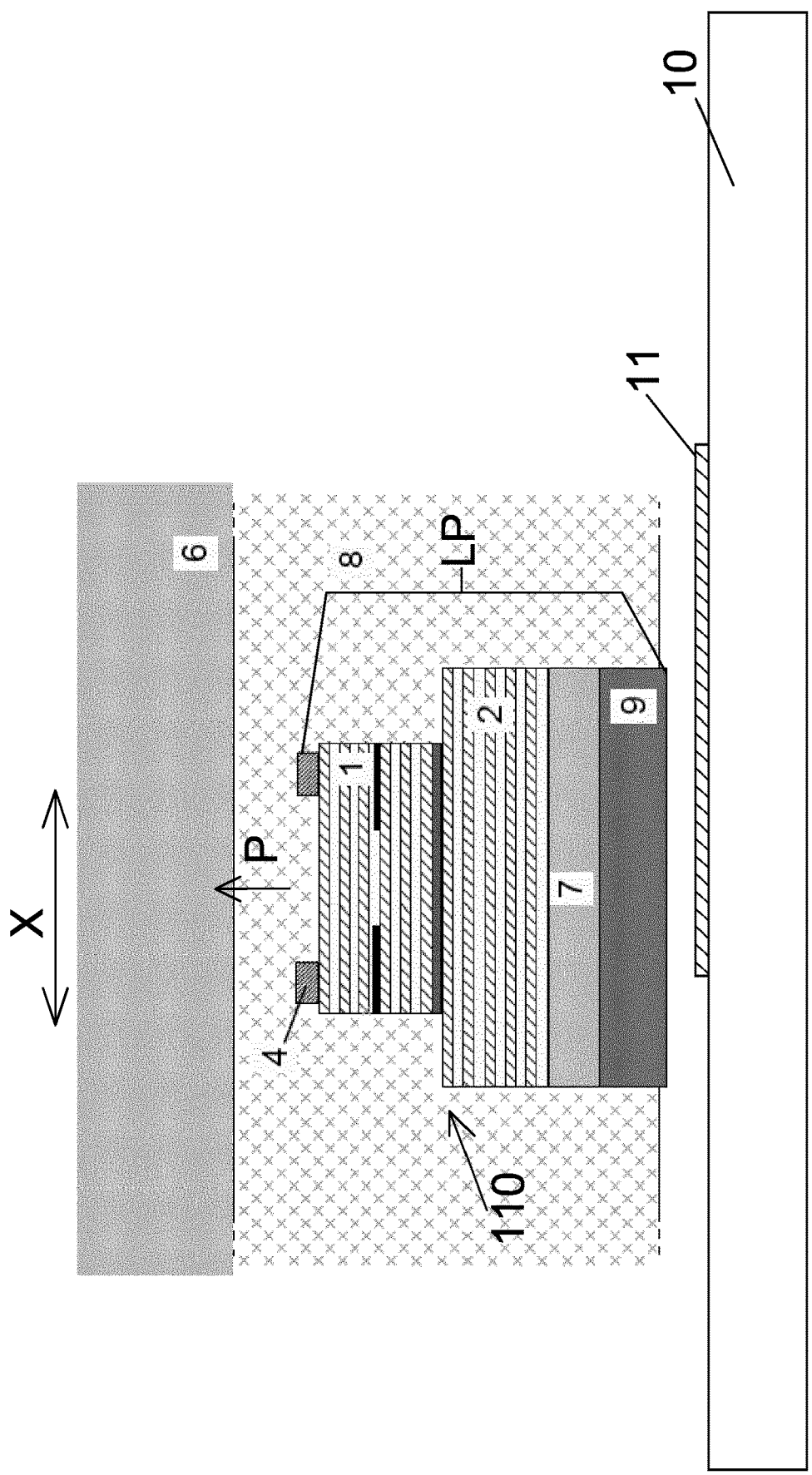

FIG. 5 shows the substrate-less layered pillar LP after depositing a metal layer 9 on the exposed first contact layer 7. The base of the substrate-less layered pillar LP is now formed by the metal layer 9.

The substrate-less layered pillar LP of FIG. 5 is fully processed and forms a self-contained vertical cavity laser structure 110. The self-contained vertical cavity laser structure 110 has a foot print (size in cross-section) one order of magnitude smaller then today's prior art VCSELs.

The base of the layered pillar LP is ready for bonding, using one of the wealth of existing of bonding technologies (adhesive, soldering, thermocompression, ultrasonic). Since all the materials (i.e. the protection material 8 and the material of carrier 6) used for carrying the layered pillar LP are preferably transparent, the layered pillar LP can be mounted with large precision on a second substrate 10 as indicated by an arrow X in FIG. 5.

Figure 6:
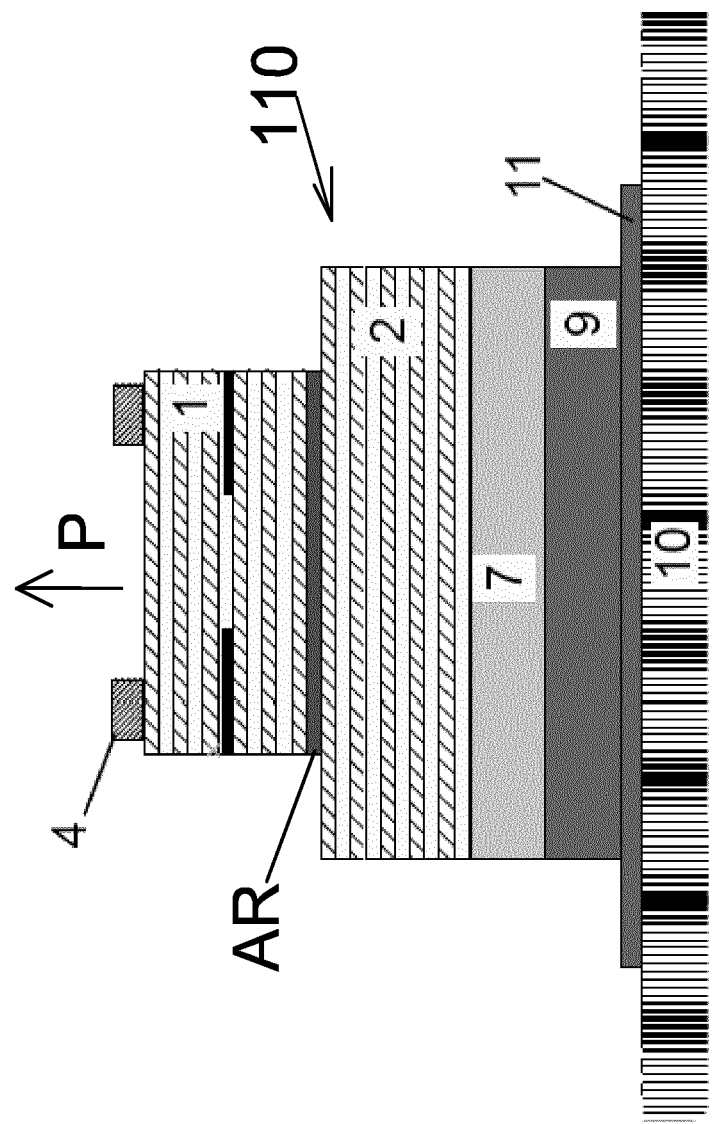

The second substrate 10 may comprise a contact 11 and for instance a Si-based driver chip. After bonding the base of the layered pillar LP to the second substrate 10 the carrier 6 and the protection material 8 may be removed. FIG. 6 illustrates the self-contained vertical cavity laser structure 110 aligned and bonded to the electrical contact pad 11 of the second substrate 10. By injecting electrical current through the first and second contact layers 7 and 4 of the self-contained vertical cavity laser structure 110, the active region AR may be activated to generate optical radiation P that may leave the self-contained vertical cavity laser structure 110 preferably through the first reflector 2.

FIGS. 1-6 illustrate a single pillar LP and therefore only one self-contained vertical cavity laser structure 110. Of course, a plurality of layered pillars LP may be etched into the layer stack LS and the etch stop layer 5 of FIG. 1. The layered pillars LP are preferably arranged in a two-dimensional pattern that corresponds to a two-dimensional pattern in which the pads and/or drivers are arranged on the second substrate 10.

Figure 7:
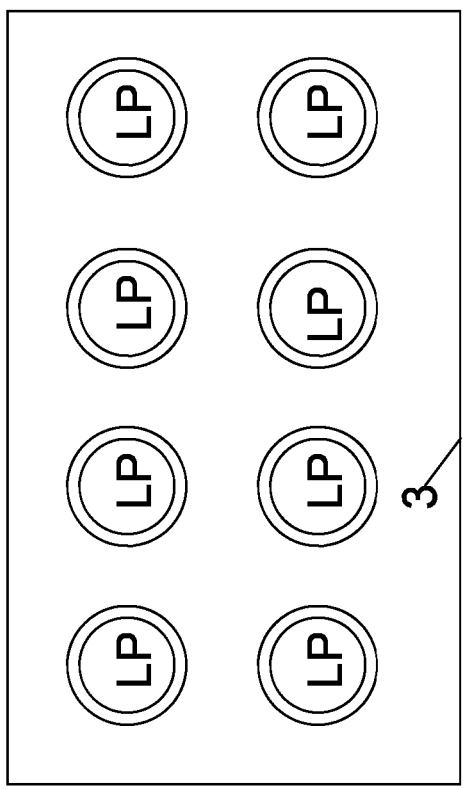
FIG. 7-9 illustrate a second exemplary embodiment of a method according to the present invention where a plurality of substrate-less radiation emitters is fabricated and thereafter mounted in parallel.

FIG. 7 shows a top-view of a substrate 3 which is provided with a plurality of layered pillars LP.

Figure 8:
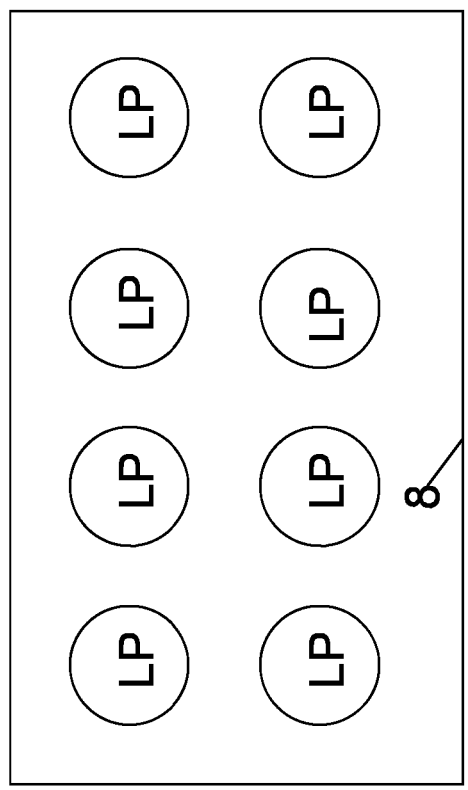

FIG. 8 illustrates a backside of the protective layer 8 which carries the layered pillars LP of FIG. 7 after removal of the substrate 3. The bases of the substrate-less layered pillars LP can be seen.

Figure 9:
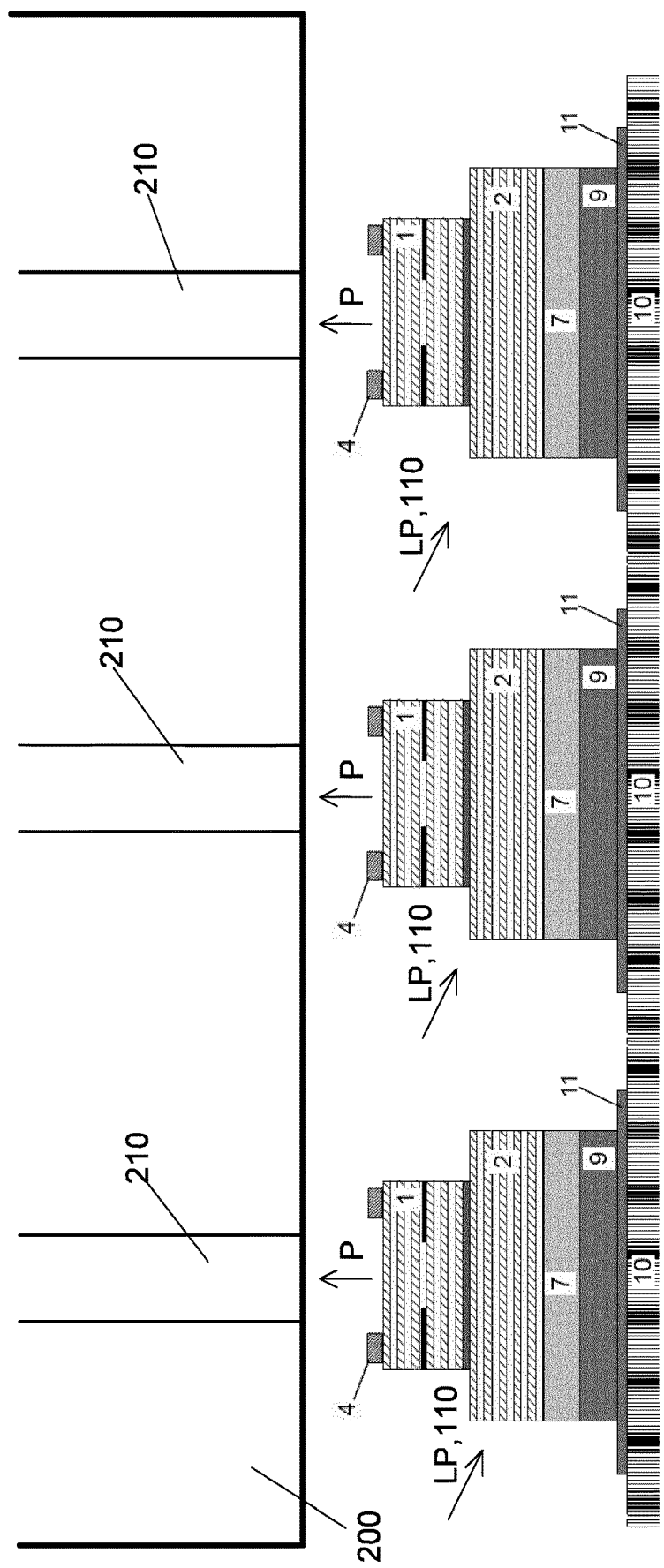

FIG. 9 illustrates a (second) substrate 10 on which a plurality of layered pillars LP are mounted as discussed above with reference to FIGS. 1-8. Above the layered pillars LP, a multi-core fiber 200 is arranged. Each core 210 of the multi-core fiber 200 is assigned to a layered pillar LP. During operation the layered pillars LP generate radiation P which is coupled into the individually assigned cores 210 of the multi-core fiber 200.

Figure 10:
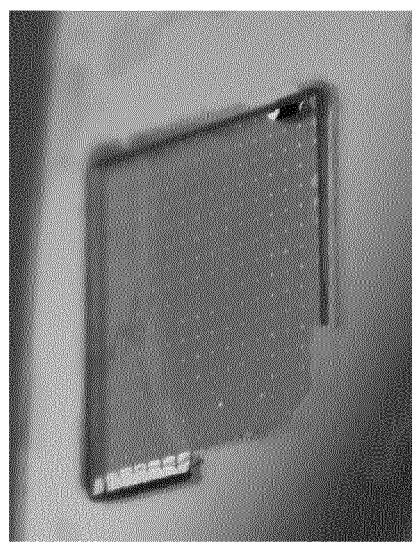

FIG. 10 shows a photograph of 256 lasers, embedded into wax, after substrate etching, and a sapphire substrate on top.

Figure 11:
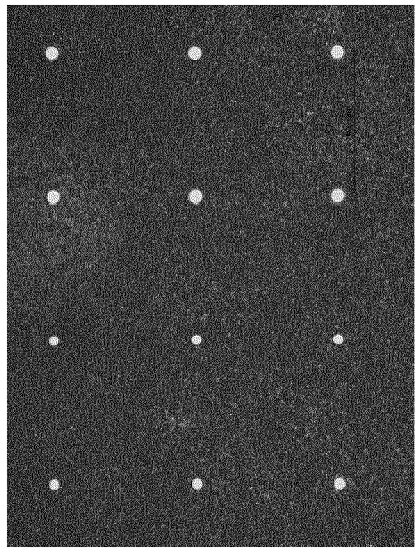
FIG. 10-13 show photographs and micrographs of fabricated devices.

FIG. 11 shows a photograph of bottom side metallization of 12 lasers with different mesa size and a pitch of 600 μm.

Figure 12:
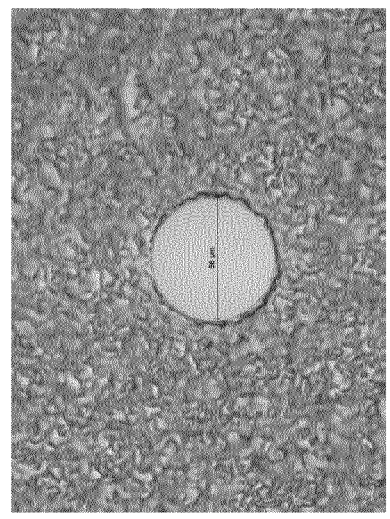

FIG. 12 shows a photograph of a bottom side of a metalized mesa with a diameter of 56 μm.

Figure 13:
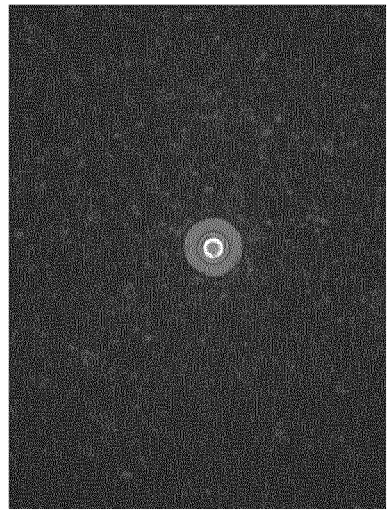

FIG. 13 shows a top side micrograph (looking through the sapphire carrier) of a laser having a footprint of 56 µm embedded in wax.

Figure 14:
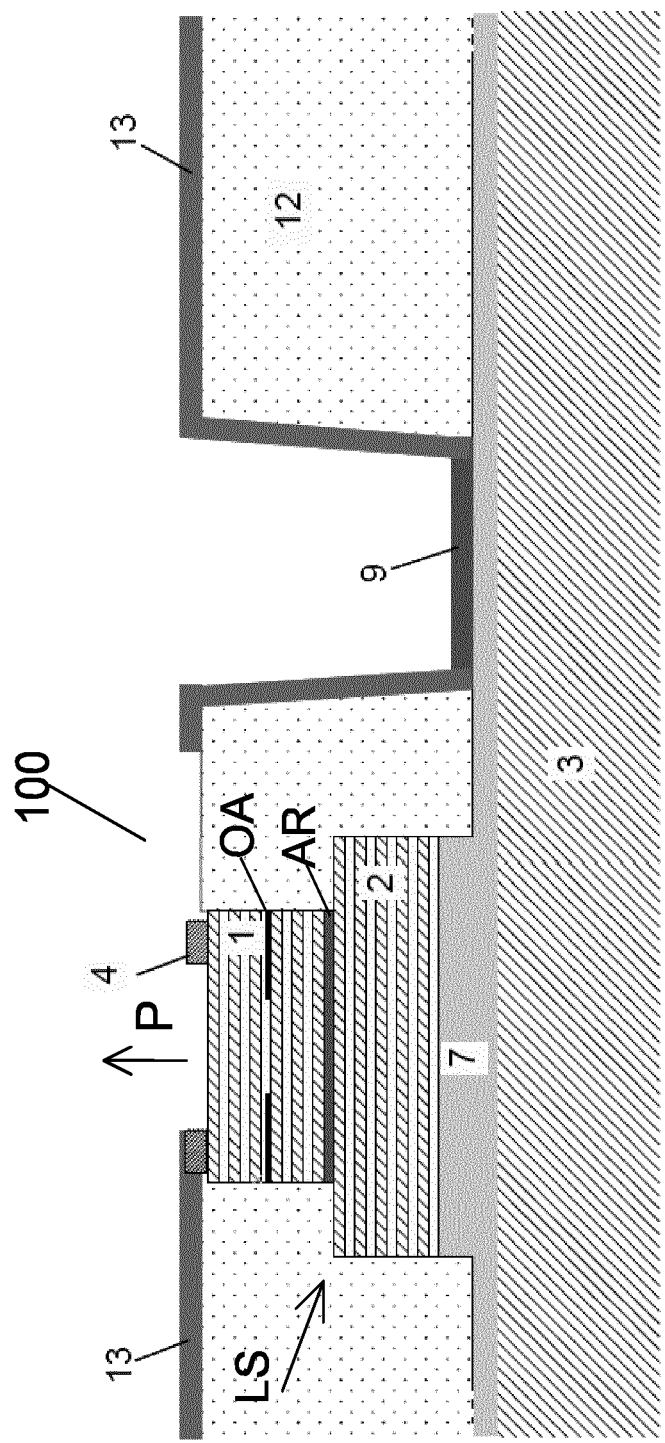
FIG. 14 illustrates a substrate-bound radiation emitter according to prior art.

The exemplary embodiments of the present invention as described above reduce the footprint of the resulting lasers by at least one order of magnitude compared to prior art (see FIG. 14). A cost reduction per device by the same order of magnitude may be obtained. This is primarily achieved by the removal of the substrate 3 and by contacting the lasers independently from two sides. Reduction of the footprint enables an increase of the device density, matching the geometries of multi-core fibers and allows easy heterogeneous integration of the photonic device with the driver leading to high bit rate, energy efficient transmitter modules.

Figure 16:
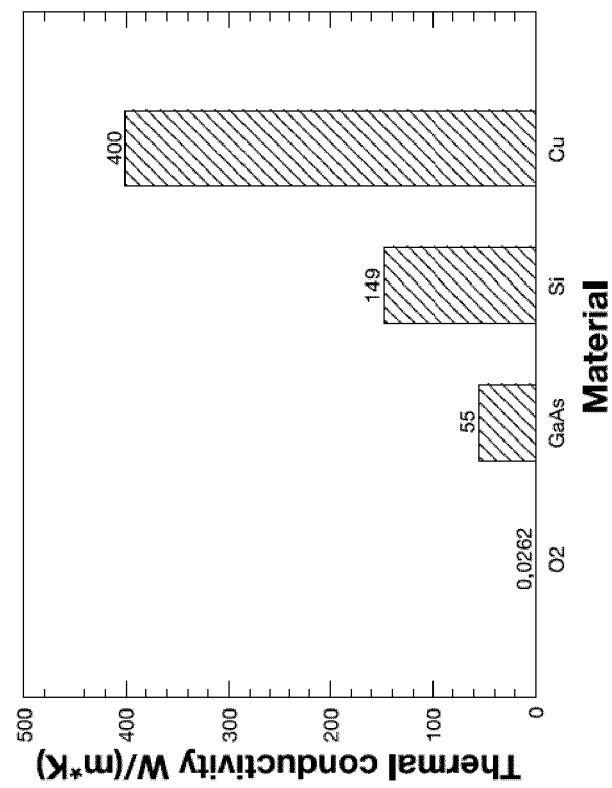
FIG. 16 illustrates a typical intrinsic small signal response, a small signal response effected by thermal effects, and a small signal response effected by thermal effects and parasitics.
Figure 15:
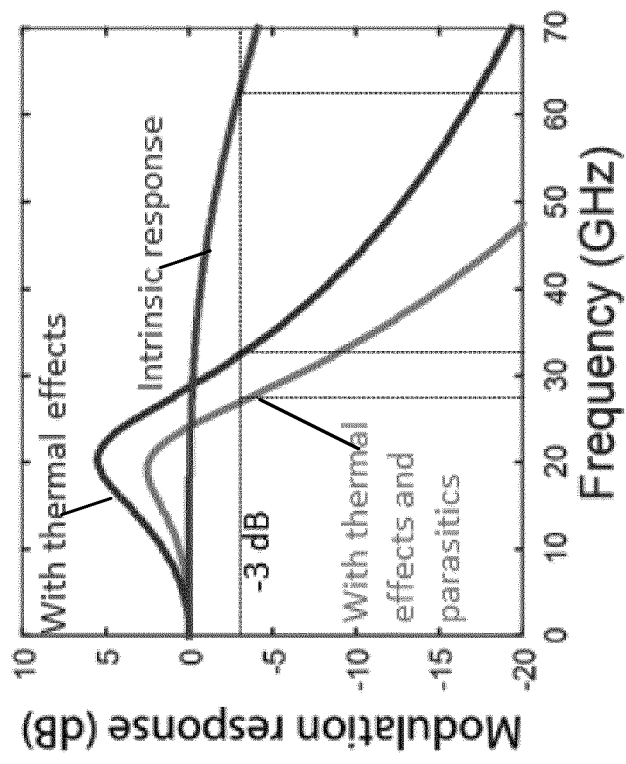
FIG. 15 shows heat conductivities of different materials.

Release of devices from the substrate on which they were grown, e.g. GaAs, and deposition onto Si or even Cu showing larger heat conductivity (see FIG. 15) improves their thermal properties, such that thermal roll-over, typically limiting the output power occurs at much larger currents and at the same time the cut-off frequency and maximum bit rate are increased. In addition, deposition of the laser on the driver or at least reduction of the distance to it eliminates bonding wires or reduces their length and their number, leading to an important reduction of parasitics, again increasing the cut-off frequency and the maximum bit rate. Both advantages together enable to approach the intrinsic limit of the 3 dB cut-off frequency, which is until now not possible. FIG. 16 illustrates a typical intrinsic small signal response, a small signal response effected by thermal effects, and a small signal response effected by thermal effects and parasitics.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the word "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one ore more) of the present dependent claims (regardless of the present claim structure). Therefore, the applicant may direct further patent claims towards other claim combinations at a later stage of the prosecution.

The invention claimed is:

1. Method of fabricating at least one radiation emitter comprising the steps of
   depositing an etch stop layer on a top side of a substrate;
   depositing a layer stack on the etch stop layer, said layer stack comprising a first contact layer, a first reflector, an active region, a second reflector, and a second contact layer;
   locally removing the layer stack and the etch stop layer, and thereby forming at least one mesa, said at least one mesa comprising an unremoved section of the etch stop layer and a layered pillar which forms a vertical cavity laser structure based on the unremoved layer stack inside the at least one mesa;
   depositing a protection material on the top side of the substrate and thereby embedding the entire mesa in the protection material wherein the backside of the substrate remains unprotected;
   removing the substrate by applying at least one etching chemical that is capable of etching the substrate but incapable or less capable of etching the etch stop layer and the protection material;
   removing the etch stop layer and thereby exposing the first contact layer of the at least one layered pillar;
   mounting a carrier on top of the protection material;
   providing a second substrate;
   mounting the base of the at least one layered pillar on at least one electrical contact pad that is already located on the second substrate;
   wherein said step of locally removing the layer stack and the etch stop layer further includes locally removing substrate material from the top side of the substrate such that the at least one mesa also comprises an unremoved surface section of the substrate;
   wherein said step of depositing the protection material on the top side of the substrate also includes embedding the unremoved surface section of the substrate in the protection material;
   wherein said step of mounting the base on the electrical contact pad is carried out before removing the protection material;
   wherein the base is mounted on the electrical contact pad after aligning the base relative to the electrical contact pad by mechanically adjusting the positions of the carrier and the second substrate relative to each other;
   wherein the protection material is transparent for visible light; and
   wherein the carrier is transparent for visible light.

2. Method of claim 1 wherein
   said step of locally removing the layer stack and the etch stop layer further includes locally removing substrate material from the top side of the substrate such that the at least one mesa also comprises an unremoved surface section of the substrate; and
   said step of depositing the protection material on the top side of the substrate also includes embedding the unremoved surface section of the substrate in the protection material.

3. Method of claim 1
   wherein the first contact layer of the layered pillar is exposed by said step of removing the etch stop layer; and
   wherein a metal layer is deposited on the exposed first contact layer, the metal layer then replacing the first contact layer in forming the base of the layered pillar.

4. Method of claim 1 further comprising the steps of
   arranging at least one electrical driver on the second substrate before or after mounting the at least one layered pillar,
   wherein the at least one electrical driver is configured to electrically drive the vertical cavity laser structure of the at least one layered pillar and is connected to or carries the at least one electrical contact pad.

5. Method of claim 1
   wherein said step of mounting the base on the electrical contact pad is carried out before removing the protection material; and wherein the base is mounted on an electrical contact pad after aligning the base relative to the electrical contact pad by mechanically adjusting the positions of the protection material and the second substrate relative to each other.

6. Method of claim 1 further comprising the steps of mounting a carrier on top of the protection material; and
aligning the base relative to the electrical contact pad by mechanically adjusting the positions of the carrier and the second substrate relative to each other.

7. Method of claim 1
wherein the carrier and the protection material are transparent for visible light and/or
wherein the at least one layered pillar itself forms the at least one radiation emitter.

8. Method of claim 1
wherein said step of locally removing the layer stack includes forming a plurality of mesas, each of which comprises an unremoved section of the etch stop layer and a layered pillar which forms a vertical cavity laser structure based on the unremoved layer stack inside the respective mesa;
wherein said step of depositing a protection material on the top side of the substrate includes embedding said plurality of mesas in the protection material; and
wherein said step of removing the substrate by applying said at least one etching chemical includes detaching the layered pillars from one another and provides a plurality of separate self-contained vertical cavity laser structures.

9. Method of claim 1
wherein said step of locally removing the layer stack and the etch stop layer further includes locally removing substrate material from the top side of the substrate such that each mesa also comprises an unremoved surface section of the substrate;
wherein said step of depositing the protection material also includes embedding the unremoved surface sections of the substrate; and
wherein said step of removing the etch stop layer includes exposing the first contact layer of the layered pillars.

10. Method of claim 1 further comprising the steps of
fabricating at least one driver for each of the layered pillars on a second substrate, wherein each of the drivers provides an electrical contact pad and wherein the position of each contact pad on the second substrate corresponds to the position of an individually assigned layered pillar inside the protection material; and
aligning the bases of the layered pillars relative to the electrical contact pads by mechanically adjusting the positions of the protection material and the second substrate relative to each other.

11. Method according-te receding claimsof claim 1 further comprising the steps of
mounting a carrier on top of the protection material; and
aligning the bases of layered pillars relative to the electrical contact pads by mechanically adjusting the positions of the carrier and the second substrate relative to each other.

12. Method of claim 1
wherein the etch stop layer consists of or comprises AlAs-material and/or AlGaP; and/or
wherein the layer stack consists of or comprises layers of $Ga_xAl_{1-x}As$-material, $Ga_xIn_{1-x}As_yP_{1-y}$-material, or similar ternary, quaternary or quinternary III-V-materials; and/or
wherein the protection material is a resin; and/or
wherein the carrier consists of or comprising sapphire and/or silicon carbide; and/or
wherein said at least one etching chemical that is used to remove the substrate consists of or comprises a mixture of $H_2O_2$ and $NH_4OH$, and/or a mixture of $H_2O_2$ and $H_2SO_4$, and/or a mixture of $H_2O_2$ and $C_6H_8O_7$, and/or a mixture of $H_2SO_4$ and $KBrO_3$, and/or a mixture of $H_2O_2$ and HCl; and/or
wherein said step of locally removing the layer stack and the etch stop layer includes dry etching, preferably based on chlorine and/or bromine gas; and/or
wherein said step of locally removing the layer stack and the etch stop layer includes forming a stepped mesa comprising at least an upper mesa section and a lower mesa section of different cross-sections; and/or
wherein the vertical cavity laser structure of the at least one radiation emitter is fabricated to emit radiation through the first reflector; and/or
wherein the vertical cavity laser structure of the at least one radiation emitter is fabricated to emit radiation through the second reflector; and/or
wherein the protection material is transparent for visible light; and/or
wherein the carrier is transparent for visible light.

13. Method of claim 1 wherein the fabricated radiation emitter comprises at least two separate substrate-less layered pillars,
wherein the substrate-less layered pillars each form a self-contained vertical cavity laser structure; and
wherein the substrate-less layered pillars are pieces of the very same dismembered layer stack.

14. Method of claim 13,
wherein the radiation emitter comprises a substrate on which a plurality of layered pillars is mounted;
wherein a multi-core fiber is arranged above the layered pillars; and
wherein each core of the multi-core fiber is individually assigned to a layered pillar such that during operation the layered pillars generate radiation which is coupled into the individually assigned cores of the multi-core fiber.

15. A radiation emitter comprising
an etch stop layer on a top side of a substrate;
a layer stack on the etch stop layer, said layer stack comprising a first contact layer, a first reflector, an active region, a second reflector, and a second contact layer;
the layer stack and the etch stop layer are configured to be locally removed, and thereby forming at least one mesa, said at least one mesa comprising an unremoved section of the etch stop layer and at least one layered pillar which forms a vertical cavity laser structure based on the unremoved layer stack inside the at least one mesa;
a protection material configured to be deposited on the top side of the substrate and wherein the entire mesa is embedded in the protection material wherein the backside of the substrate remains unprotected;
the substrate is configured to be removed by applying at least one etching chemical that is capable of etching the substrate but incapable or less capable of etching the etch stop layer and the protection material;
wherein when the etch stop layer is removed and the first contact layer is exposed of the at least one layered pillar;
a carrier mounted on top of the protection material;
a second substrate;

the base mounted of the at least one layered pillar on at least one electrical contact pad that is already located on the second substrate;

wherein when the layer stack and the etch stop layer is removed, the substrate material from the top side of the substrate is also removed such that the at least one mesa also comprises an unremoved surface section of the substrate;

wherein the depositing the protection material on the top side of the substrate also includes embedding the unremoved surface section of the substrate in the protection material;

wherein the mounting the base on the electrical contact pad is carried out before removing the protection material;

wherein the base is mounted on the electrical contact pad after aligning the base relative to the electrical contact pad by mechanically adjusting the positions of the carrier and the second substrate relative to each other;

wherein the protection material is transparent for visible light; and wherein the carrier is transparent for visible light.

16. Radiation emitter of claim 15, wherein the radiation emitter comprises a plurality of layered pillars mounted on the substrate;

wherein a multi-core fiber is arranged above the layered pillars; and wherein each core of the multi-core fiber is individually assigned to a layered pillar such that during operation the layered pillars generate radiation which is coupled into the individually assigned cores of the multi-core fiber.

* * * * *